(12) United States Patent
Chang et al.

(10) Patent No.: US 10,062,700 B2
(45) Date of Patent: Aug. 28, 2018

(54) SEMICONDUCTOR STORAGE DEVICE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW); Chien-Cheng Tsai, Kaohsiung (TW); Feng-Ming Huang, Pingtung County (TW); Hsien-Shih Chu, Kaohsiung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/458,946

(22) Filed: Mar. 14, 2017

(65) Prior Publication Data

US 2018/0190663 A1 Jul. 5, 2018

(30) Foreign Application Priority Data

Dec. 30, 2016 (CN) .......................... 2016 1 1256275

(51) Int. Cl.
*H01L 27/108* (2006.01)

(52) U.S. Cl.
CPC ........ *H01L 27/1085* (2013.01); *H01L 27/108* (2013.01); *H01L 27/10844* (2013.01); *H01L 27/10847* (2013.01); *H01L 27/10882* (2013.01); *H01L 27/10888* (2013.01)

(58) Field of Classification Search
CPC ............ H01L 27/108; H01L 27/10844; H01L 27/10888
See application file for complete search history.

(56) References Cited

U.S. PATENT DOCUMENTS

2016/0276349 A1 9/2016 Kwon
2017/0330882 A1* 11/2017 Wang ................ H01L 27/10823

* cited by examiner

*Primary Examiner* — Phat X Cao
*Assistant Examiner* — Diana C Vieira
(74) *Attorney, Agent, or Firm* — Winston Hsu

(57) ABSTRACT

A manufacturing method of a semiconductor storage device includes forming a plurality of bit line structures on a semiconductor substrate and forming a plurality of storage node contacts disposed between the bit line structures. The method of forming the storage node contacts includes forming a plurality of conductive patterns on the semiconductor substrate followed by performing an etching back process to the conductive patterns for decreasing a thickness of the conductive patterns. The manufacturing method further includes forming a plurality of isolation patterns between the conductive patterns, wherein the isolation patterns are formed after forming the plurality of conductive patterns and before the etching back process. According to the present invention, the storage node contacts are formed by first forming the conductive patterns and then forming the isolation patterns between the conductive patterns, so as to simplify manufacturing process and increase process yield.

11 Claims, 7 Drawing Sheets

SEMICONDUCTOR STORAGE DEVICE AND MANUFACTURING METHOD THEREOF

BACKGROUND OF THE INVENTION

1. Field of the Invention

The present invention relates to a manufacturing method of semiconductor storage device, particularly to a manufacturing method of semiconductor storage device including storage node contacts.

2. Description of the Prior Art

Dynamic random access memory (DRAM) is a type of volatile storage device which is an indispensable key part of many electronic products. DRAM includes a great number of memory cells aggregated into an array for storing data, wherein each of the memory cells composed of a metal oxide semiconductor (MOS) transistor and a capacitor connected in series.

According to demands of products, the need to continuously increase the density of the memory cells in the array leads to more difficult and complex processes and design. Hence, industries keep making efforts to design new structures and/or processes in order to decrease the cost while increasing the yield under the limit of product standard.

SUMMARY OF THE INVENTION

The present invention provides a manufacturing method of semiconductor storage device, wherein storage node contacts are formed by first forming conductive patterns and then forming isolation patterns between the conductive patterns, so as to simplify manufacturing process and increase manufacturing yield.

According to an embodiment of the present invention, a manufacturing method of semiconductor storage device includes the following steps. First, a semiconductor substrate is provided, wherein the semiconductor substrate includes a plurality of active areas. Then, a plurality of bit line structures are formed on the semiconductor substrate, and a plurality of storage node contacts are formed between the plurality of bit line structures, wherein each of the storage node contacts is formed on one of the plurality of the active areas. The step of forming the storage node contacts includes forming a plurality of conductive patterns on the semiconductor substrate, wherein each of the conductive patterns straddles one of the bit line structures; and performing an etching back process to the conductive patterns for decreasing the thickness of the conductive patterns so as to form the storage node contacts. And a plurality of isolation patterns are formed between the plurality of conductive patterns, wherein the plurality of isolation patterns are formed after forming the plurality of conductive patterns and before the etching back process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a cross-sectional view taken along a cross-sectional line A-A' of FIG. 1.

FIG. 3 is a top view schematic diagram in a step subsequent to FIG. 1.

FIG. 4 is a cross-sectional view taken along a cross-sectional line B-B' of FIG. 3.

FIG. 5 is a top view schematic diagram in a step subsequent to FIG. 3.

FIG. 6 is a cross-sectional view taken along a cross-sectional line C-C' of FIG. 5.

FIG. 7 is a top view schematic diagram in a step subsequent to FIG. 5.

FIG. 8 is a cross-sectional view taken along a cross-sectional line D-D' of FIG. 7.

FIG. 9 is a top view schematic diagram in a step subsequent to FIG. 7.

FIG. 10 is across-sectional view taken along a cross-sectional line E-E' of FIG. 9.

FIG. 11 is a top view schematic diagram in a step subsequent to FIG. 9.

FIG. 12 is a cross-sectional view taken along a cross-sectional line F-F' of FIG. 11.

FIG. 13 is a top view schematic diagram in a step subsequent to FIG. 11.

FIG. 14 is a cross-sectional view taken along a cross-sectional line G-G' of FIG. 13.

DETAILED DESCRIPTION

Figure 1:
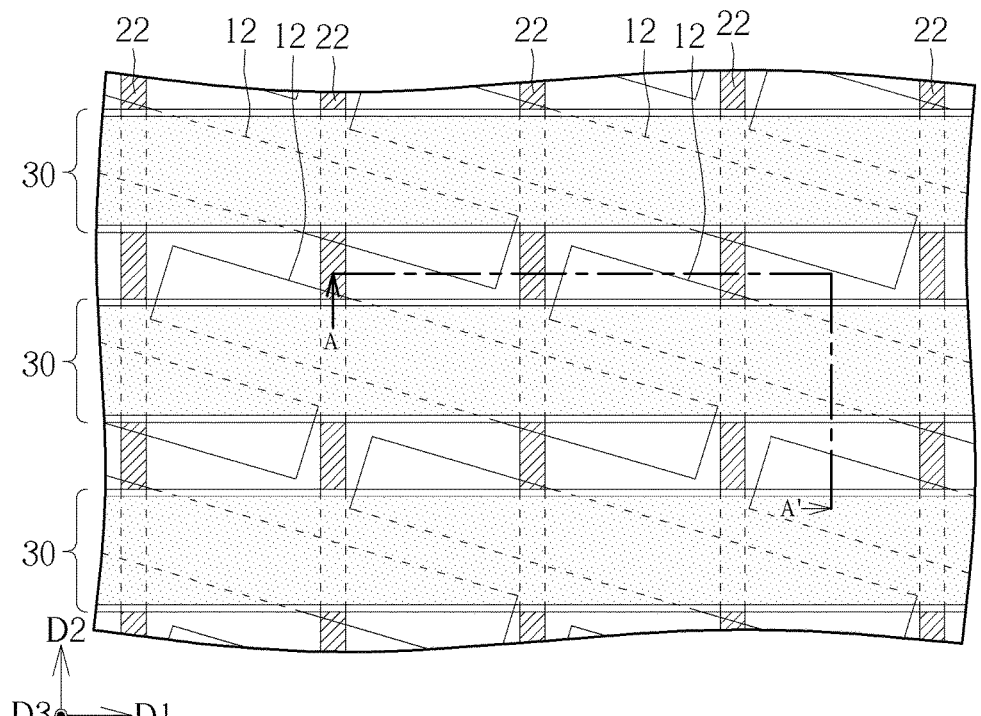
FIGS. 1-14 are schematic diagrams illustrating a manufacturing method of a semiconductor storage device according to a first embodiment of the present invention.
Figure 2:
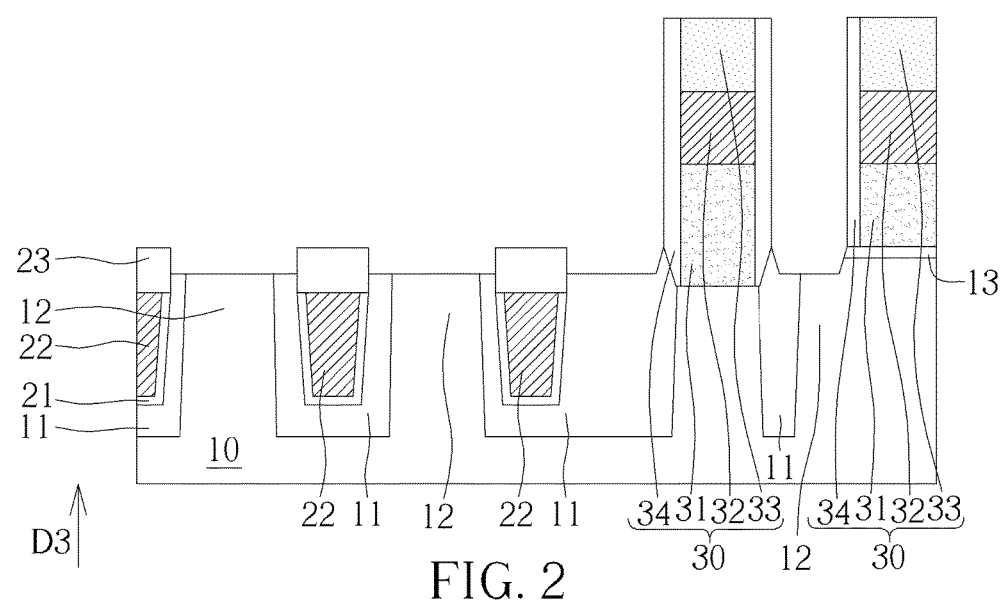
Figure 3:
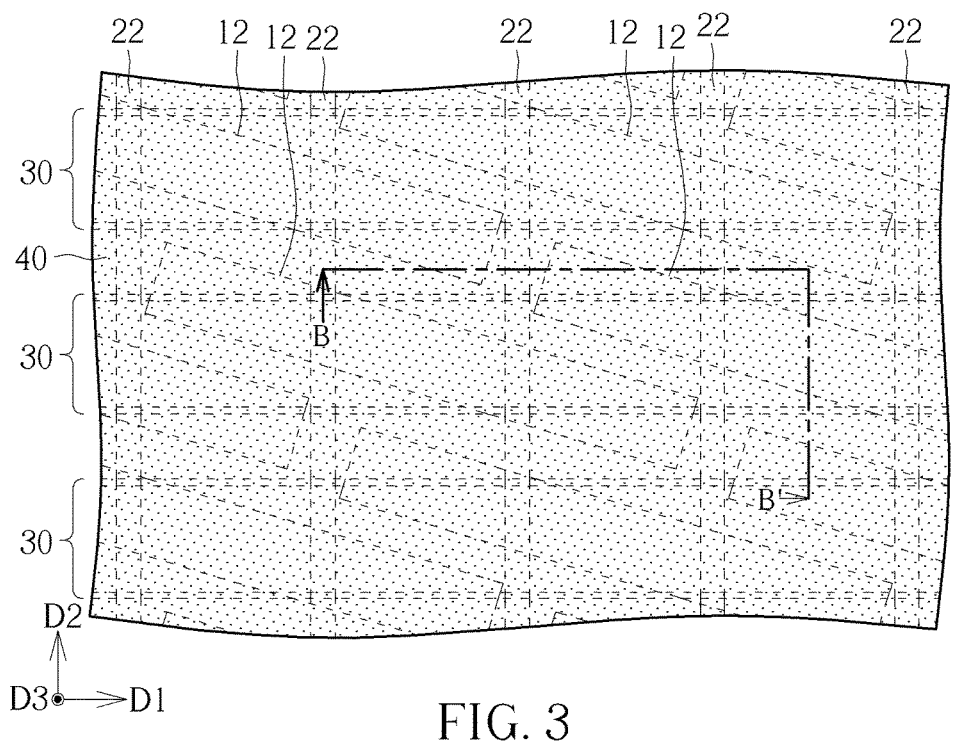
Figure 4:
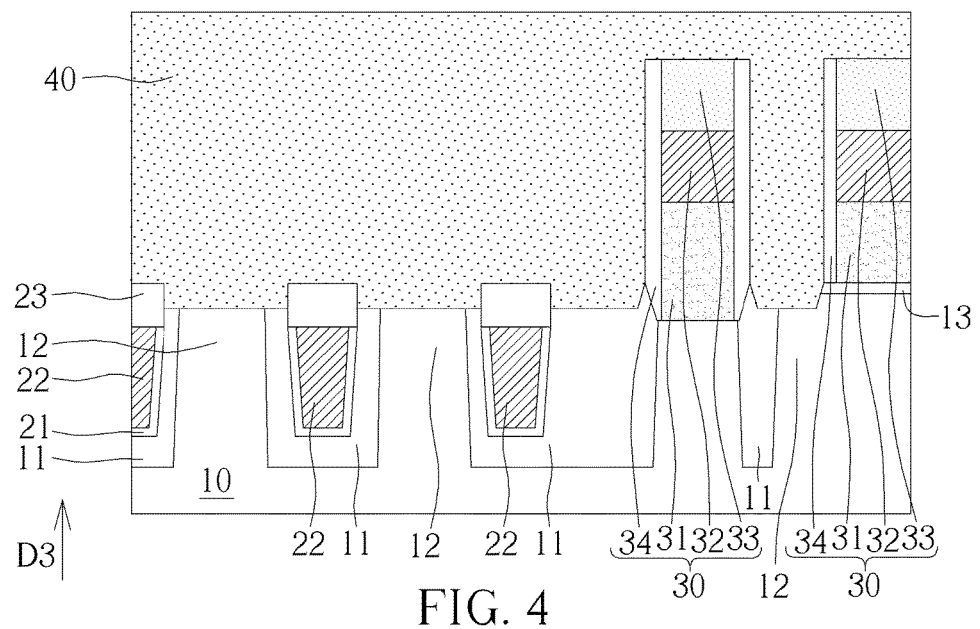
Figure 5:
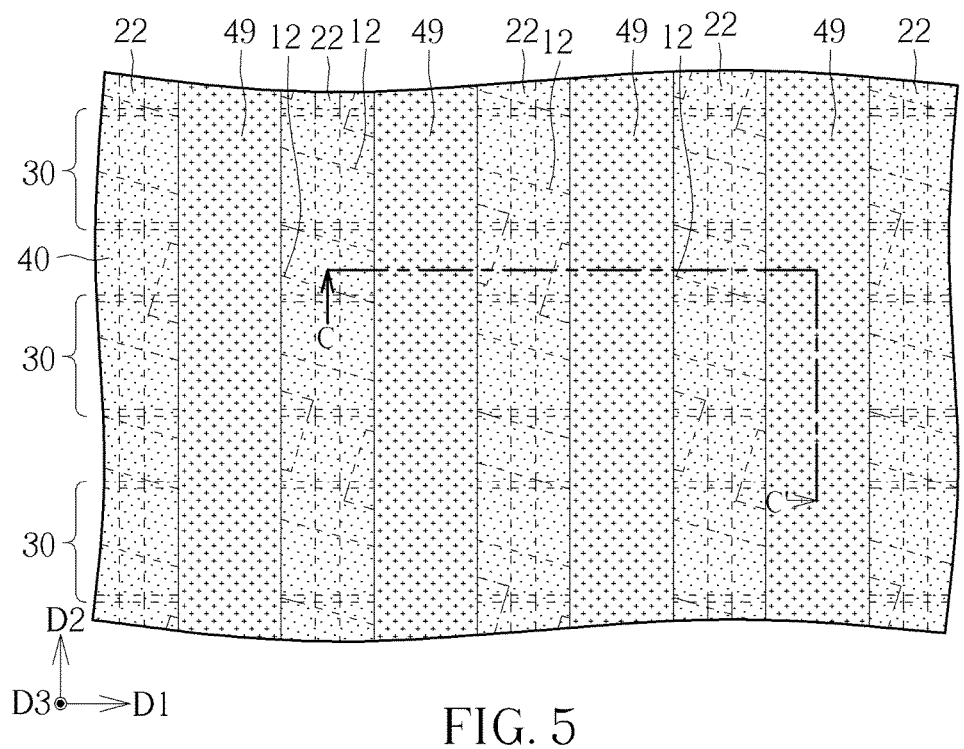
Figure 6:
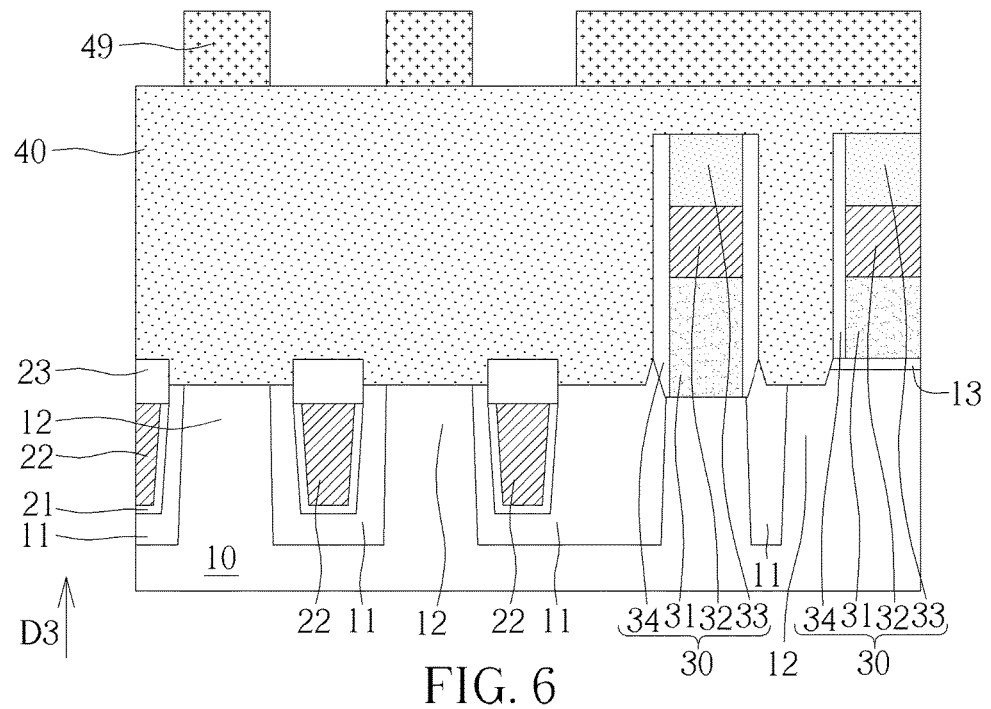
Figure 7:
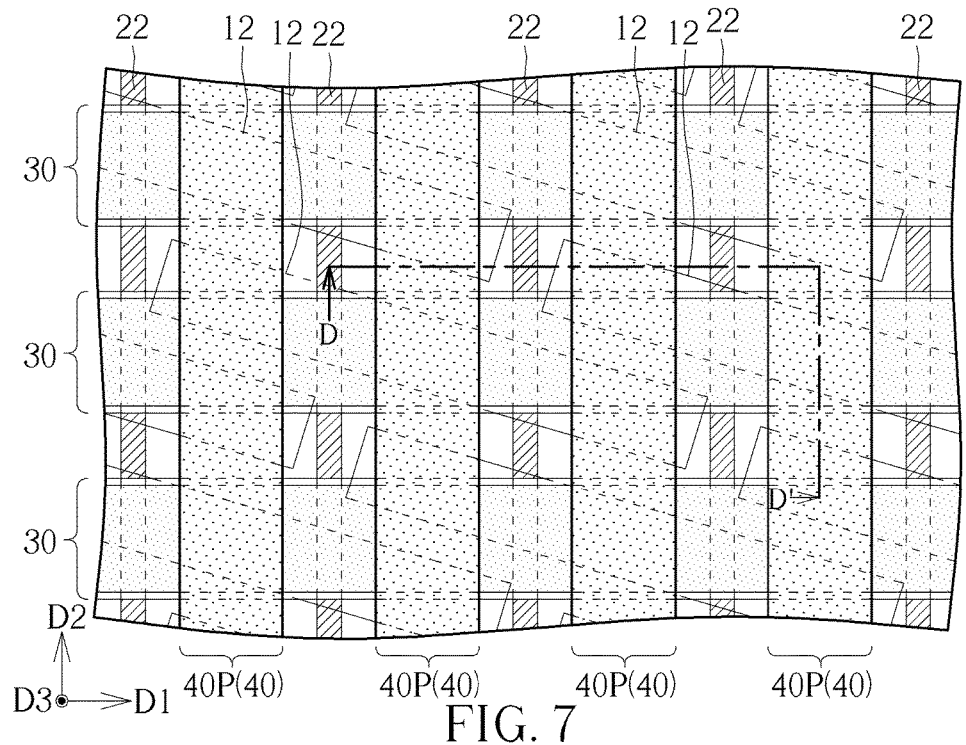
Figure 8:
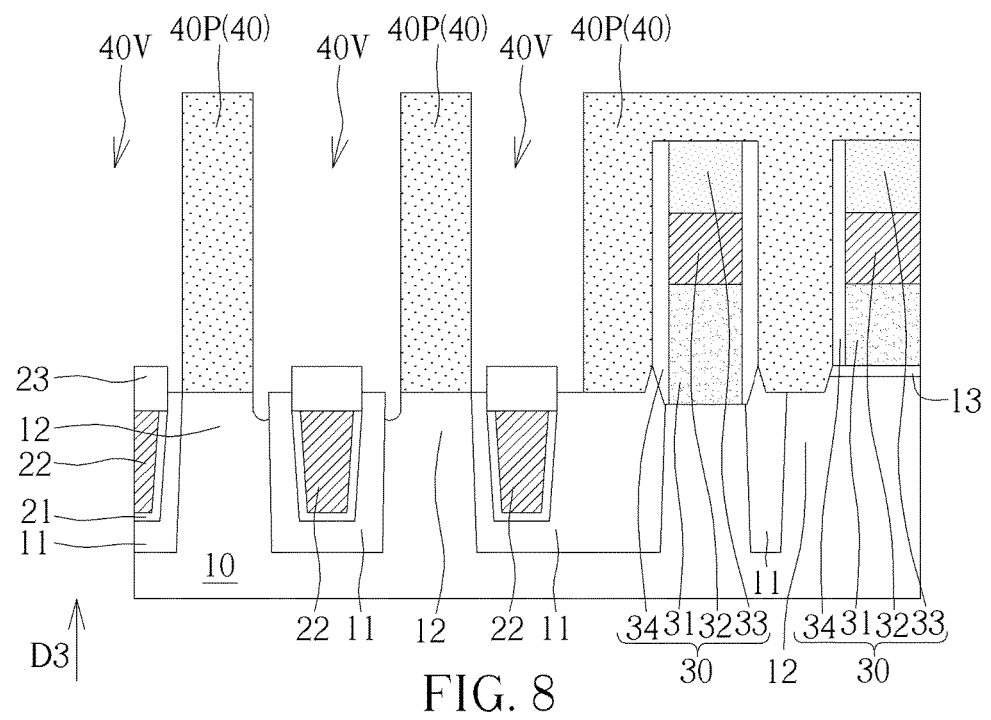
Figure 9:
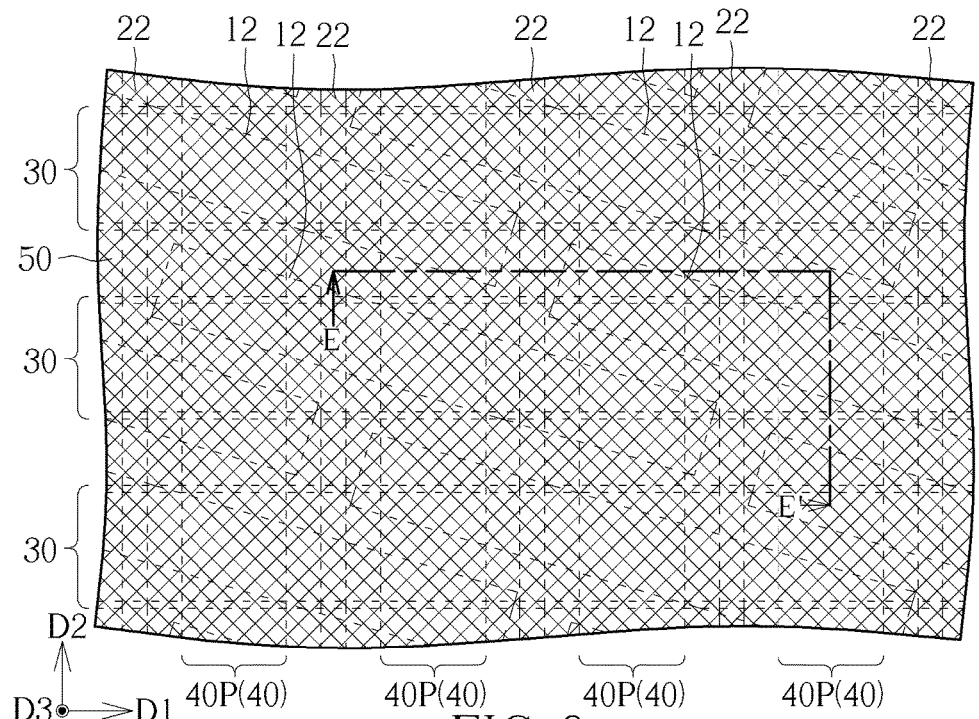
Figure 10:
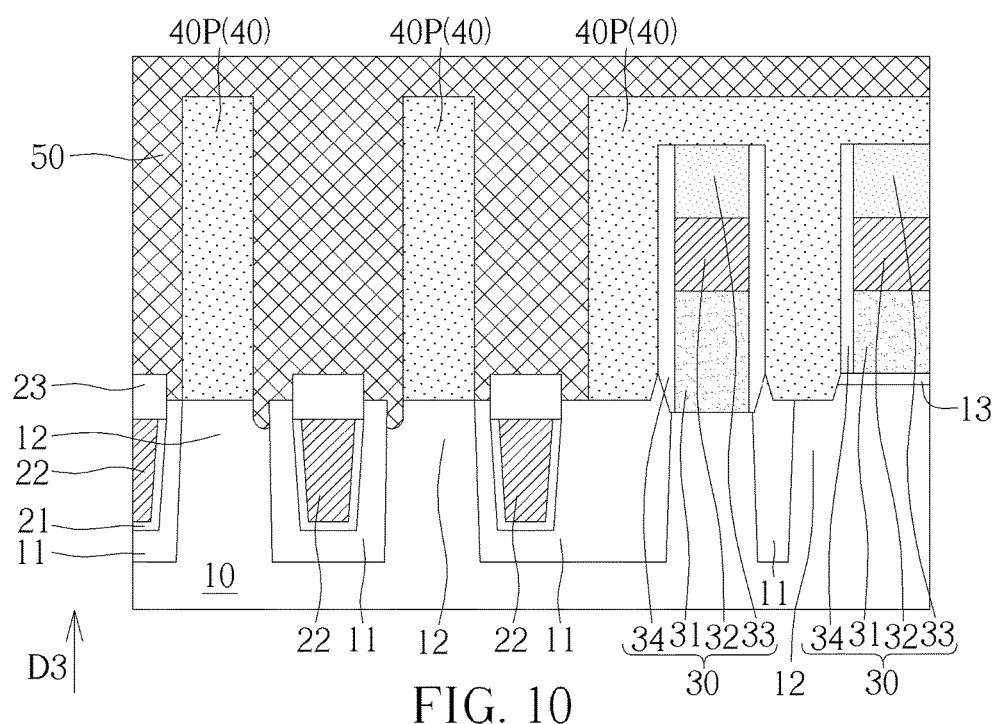
Figure 11:
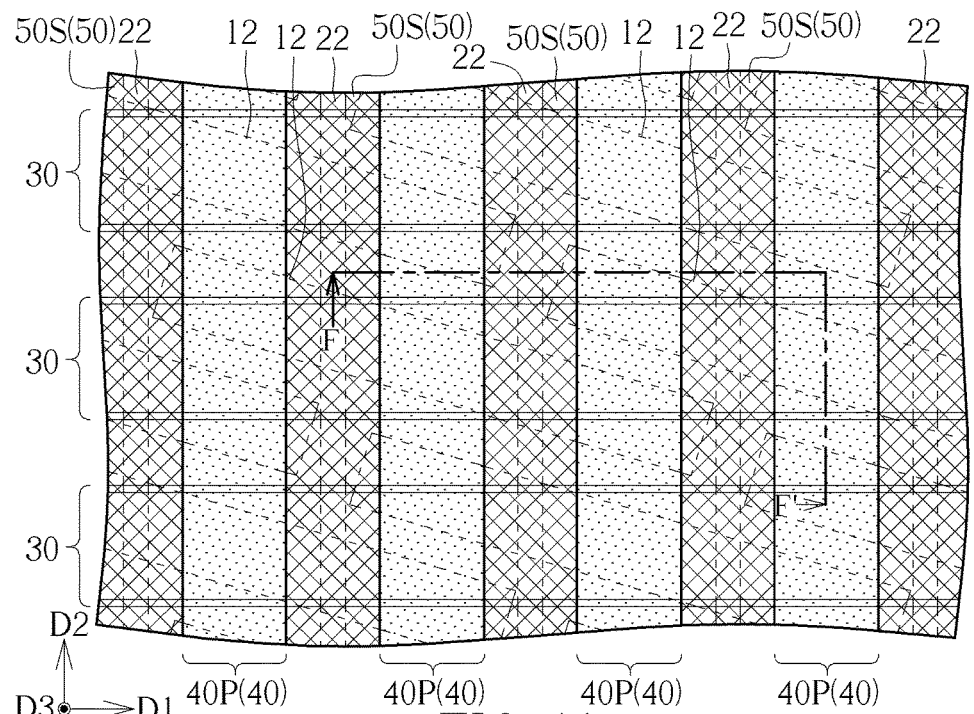
Figure 12:
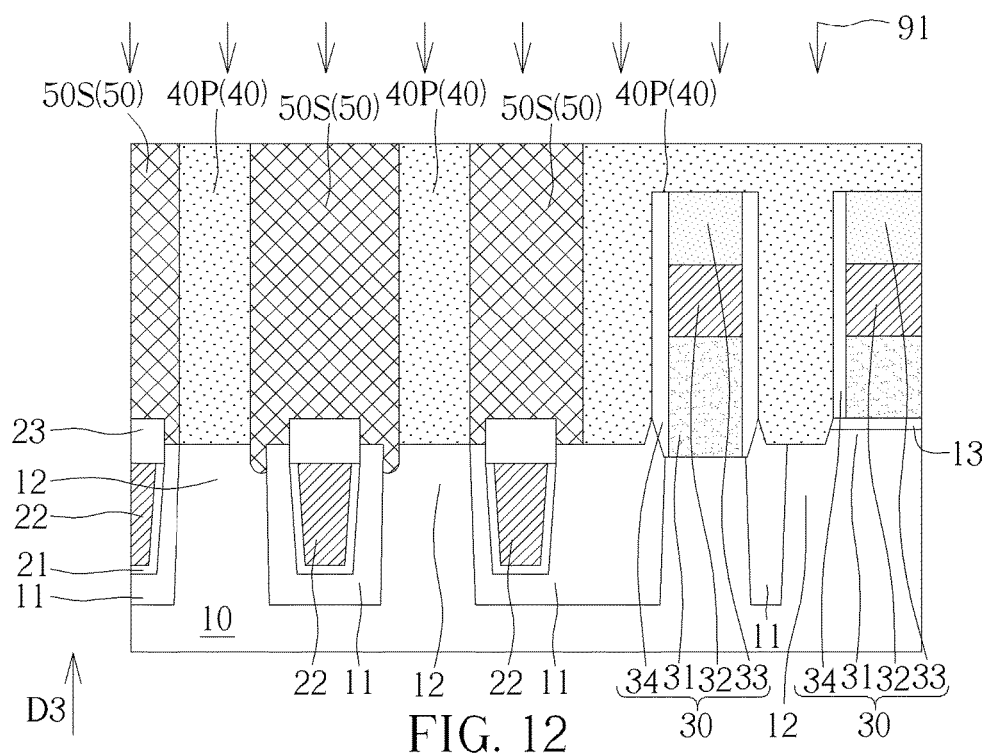
Figure 13:
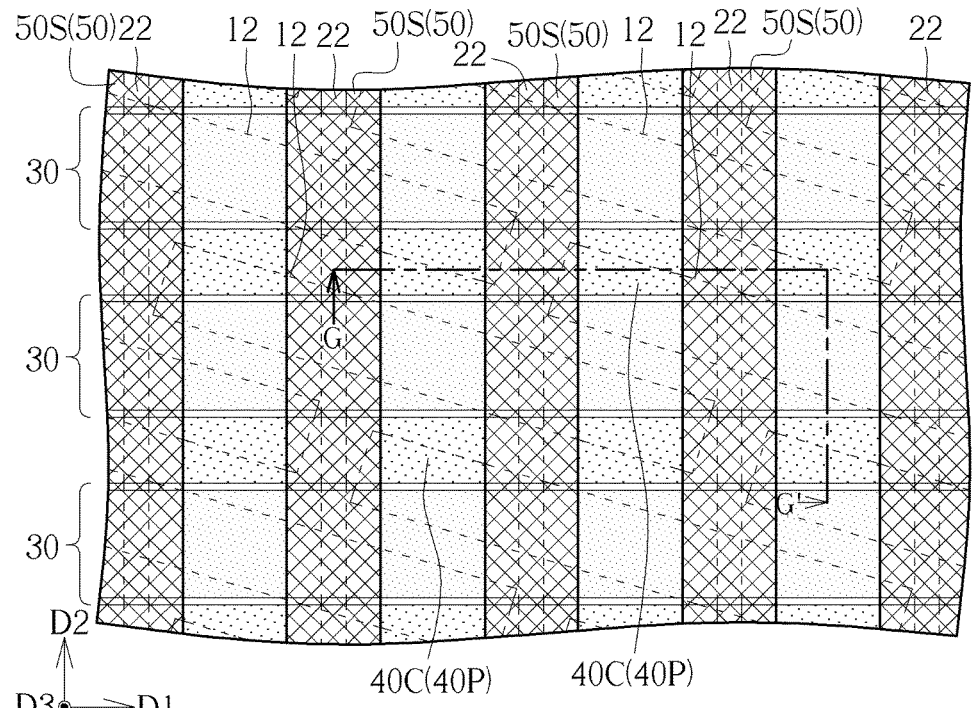
Figure 14:
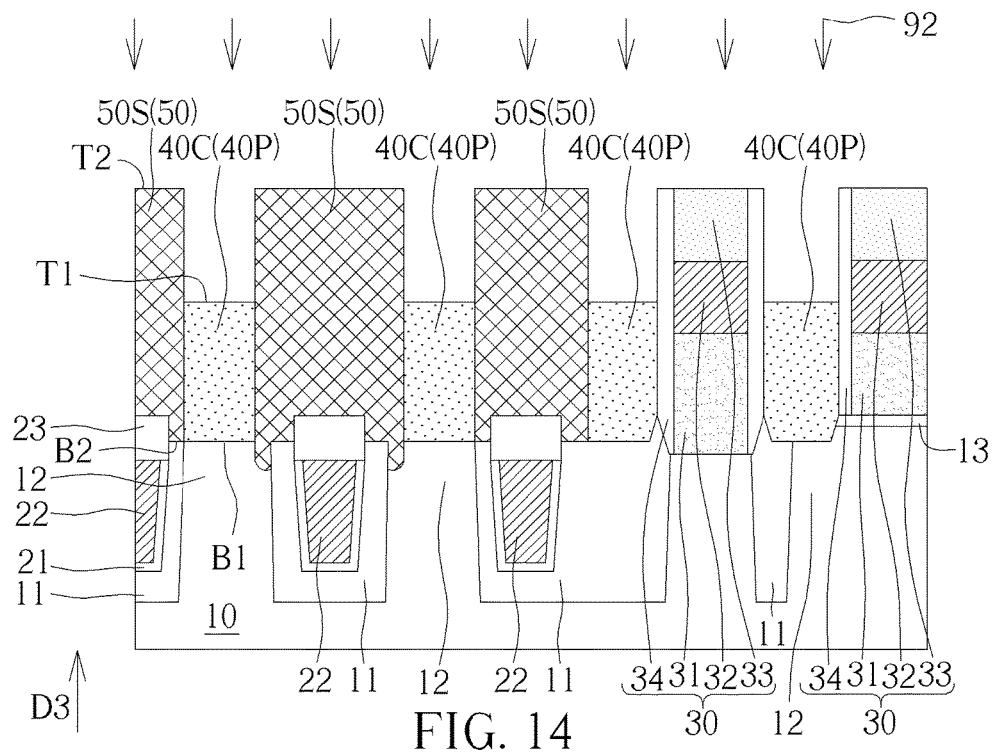

Referring to FIGS. 1-14, FIGS. 1-14 are schematic diagrams illustrating a manufacturing method of a semiconductor storage device according to a first embodiment of the present invention, in which FIG. 1, FIG. 3, FIG. 5, FIG. 7, FIG. 9, and FIG. 13 are top view schematic diagrams, FIG. 2 is a cross-sectional view taken along a cross-sectional line A-A' of FIG. 1, FIG. 4 is a cross-sectional view taken along a cross-sectional line B-B' of FIG. 3, FIG. 6 is a cross-sectional view taken along a cross-sectional line C-C' of FIG. 5, FIG. 8 is a cross-sectional view taken along a cross-sectional line D-D' of FIG. 7, FIG. 10 is a cross-sectional view taken along a cross-sectional line E-E' of FIG. 9, FIG. 12 is a cross-sectional view taken along a cross-sectional line F-F' of FIG. 11, and FIG. 14 is a cross-sectional view taken along a cross-sectional line G-G' of FIG. 13. This embodiment provides a manufacturing method of a semiconductor storage device, including the following steps. First, as shown in FIG. 1 and FIG. 2, a semiconductor substrate 10 is provided, and the semiconductor substrate 10 includes a plurality of active areas 12. The semiconductor substrate 10 may include silicon substrate, epitaxial silicon substrate, silicon germanium substrate, silicon carbide substrate or silicon-on-insulator (SOI) substrate, but not limited thereto. A shallow trench isolation 11 is formed in the silicon substrate 10 and by which a plurality of active areas 12 are defined. The shallow trench isolation 11 can be formed by etching the semiconductor substrate 10 to form a plurality of trenches followed by filling the trenches with insulation materials such as silicon nitride or silicon oxynitride, but not limited thereto. In some embodiments, the shallow trench isolation 11 can be formed by other methods as needed. In addition, a plurality of word lines 22 can be formed in the semiconductor substrate 10, and the word lines 22 in this embodiment can be buried word lines, but not limited thereto. The word lines 22 may be formed by being buried in the semiconductor substrate 10 and shallow trench isolation 11. A gate dielectric layer 21 may be formed between the word lines 22 and the semiconductor substrate 10, and a word line capping layer 23 may be formed to cover on the word lines 22. The gate dielectric layer 21, the word lines 22 and the word line capping layer 23 as mentioned above may be formed by first forming a plurality of trenches in the semiconductor substrate 10 and the shallow trenches isolation 11 followed by forming the gate dielectric layer 21, the word lines 22 and the word line capping layer 23 sequentially in the trenches, but not limited thereto. In some embodiments, the gate dielectric layer 21 may include silicon oxide or other proper dielectric materials, the word lines 22 may include aluminum, tungsten, copper, titanium aluminide (TiAl) or other proper conductive materials, and the word line capping layer may include silicon nitride, silicon oxynitride, silicon carbonitride or other proper insulation materials.

And then, a plurality of bit line structures 30 are formed on the semiconductor substrate 10. In some of the embodiments, each of the bit line structures 30 may extend along a first direction D1, each of the word lines 22 may extend along a second direction D2, and each of the active areas 12 may extend along an oblique direction different from the first direction D1 and the second direction D2, but not limited thereto. Each of the bit line structures 30 is in contact with the corresponding active area 12, and the bit line structures 30 may be electrically isolated from the non-corresponding active areas 12 through a dielectric layer 13. Each bit line structure 30 may include a contact plug 31, a low resistance layer 32 and a bit line capping layer 33 sequentially deposited in a vertical direction D3. The contact plug 31 may include silicon-containing conductive materials such as poly-silicon or amorphous silicon, the low resistance layer 32 may include materials with relatively low resistance such as aluminum, tungsten, copper, titanium aluminide or other proper low resistance materials, and the bit line capping layer 33 may include insulation materials such as silicon nitride, but not limited thereto. In addition, a barrier layer (not illustrated) may be disposed between the contact plug 31 and the low resistance layer 32 as needed. The materials of the barrier may include titanium, tungsten silicide (WSi), tungsten nitride (WN) or other proper barrier materials. Moreover, the bit line structures 30 may further include a spacer 34 formed on the side walls of the contact plugs 31, the low resistance layer 32 and the bit line capping layer 33.

Next, as show in FIG. 13 and FIG. 14, a plurality of storage node contacts 40C are formed between the plurality of bit line structures 30, and each of the storage node contacts 40C is formed on one of the plurality of the active areas 12. In this embodiment, the step of forming the storage node contacts 40C may include, but not limited to, the following steps. First, as shown in FIG. 7 and FIG. 8, a plurality of conductive patterns 40P are formed on the semiconductor substrate 10, each of the conductive patterns 40P straddles at least one of the plurality of bit line structures 30. For instance, in this embodiment, each of the conductive patterns 40P may extend along a second direction D2 and straddles plural bit line structures 30, but not limited thereto. In some embodiments, each of the conductive patterns 40P may be formed with straddling only one bit line structure 30. And then, as shown in FIG. 13 and FIG. 14, an etching back process (such as the second etching back process 92 shown in FIG. 14) is performed to the conductive patterns 40P for decreasing the thickness of the conductive patterns 40P in the vertical D3 and therefore the storage node contacts 40C are formed.

The method of forming the conductive patterns 40P of this embodiment may include, but not limited to, the following steps. First, as shown in FIG. 3 and FIG. 4, a conductive layer 40 is formed on the semiconductor substrate 10 and the bit line structures 30, and a portion of the conductive layer 40 is formed between plural bit line structures 30. In this embodiment, the materials of the conductive layer 40 may include a silicon-containing conductive layer such as amorphous silicon layer, poly-silicon layer or other proper non-silicon conductive layer. It is worth mentioning that, before forming the conductive layer 40, the other material layer on the active area 12 corresponding to the conductive patterns 40P may be removed to expose a portion of the active area 12, so as to make the conductive layer 40 be in contact with the corresponding active area 12. And then, as shown in FIG. 5 to FIG. 8, a patterning process to the conductive layer 40 is performed for forming the plurality of conductive layers 40P, and a portion of each of the conductive patterns 40P is formed between two of the plurality of bit line structures 30 adjacent to each other. In some of the embodiments, a patterned mask layer 49 may be formed on the conductive layer 40, and the conductive patterns 40P may be formed by performing an etching process to the conductive layer 40 by using the patterned mask layer 49 as an etching mask, but not limited thereto. In some the embodiments, the conductive patterns 40P may be formed by performing other processes for patterning the conductive layer 40 as needed. In addition, the above mentioned etching process to the conductive layer 40 are preferably to have relatively low etching rate to the word line capping layer 23 and the shallow trench isolation 11, so as to avoid the word lines 22 being affected by the etching process. However, some portions of the active areas 12 which are not covered by the conductive patterns 40P may be partly etched by this etching process, but not limited thereto.

As shown in FIG. 13 and FIG. 14, the manufacturing method of this embodiment may further include forming a plurality of isolation patterns 50S between the conductive patterns 40P, and the isolation patterns 50S are formed after the step of forming the conductive patterns 40P and before performing a second etching back process 92. Specifically, the forming method of the isolation patterns 50S may include, but not limited to, the following steps. First, as shown in FIG. 7 to FIG. 10, an insulating layer 50 is formed on the semiconductor substrate 10 and the conductive patterns 40P, and a portion of the insulating layer 50 is formed between plural conductive patterns 40P. In other words, the insulating layer 50 is filled into the trenches 40V between the conductive patterns 40. The insulating layer 50 may include silicon nitride, silicon oxynitride, silicon carbonitride or other proper insulation materials. And then, as shown in FIG. 11 and FIG. 12, a portion of the insulating layer 50 vertically laying on the conductive patterns 40P in the vertical direction D3 is removed, so as to expose the conductive patterns 40P and form the isolation patterns 50S. In some embodiments, the isolation patterns 50S can be formed by removing the insulating layer 50 on the conductive patterns 40P in the vertical direction D3 through an etching back process (such as the first etching back process 91 shown in FIG. 12), but not limited thereto. In some other embodiments, the isolation patterns 50S may be formed through other ways by removing the insulating layer 50 vertically laying on the conductive pattern 40P in the vertical direction D3 as needed, such as chemical mechanical polishing (CMP) process. In addition, because the isolation patterns 50S are formed between the conductive patterns 40P, the isolation patterns 50S may extend along the second direction D2, and the word lines 22 may be covered by the isolation patterns 50S in the vertical direction D3. Since the isolation patterns 50S may be formed by filling the insulating layer 50 into the trenches between the conductive patterns 40P and the trenches between the conductive layers 40P expose the corresponding active areas 12, each of the isolation patterns 50S is directly in contact with at least one of the plurality of active areas 12.

As shown in FIG. 11 to FIG. 14, the second etching back process 92 is performed after forming the isolation patterns 50S. In other words, the step of removing the insulating layer 50 on the conductive patterns 40P is performed before the second etching back process 92. In addition, the conductive patterns 40 formed on the bit line structures 30 in the vertical direction D3 may also be removed by the second etching back process 92. Hence, after the second etching back process 92, a top surface of each storage node contact 40C (such as the first top surface T1 shown in FIG. 14) is lower than a top surface of each isolation pattern 50S (such as the second top surface T2 shown in FIG. 14) and the top surface of each bit line structure 30 in the vertical direction D3. After that, a conductive structure (such as storage node contact pad, not illustrated) may be formed on each of the storage node contacts 40C to electrically connected to the storage node contact 40C. Metal silicide and/or barrier layer may be formed between the storage node contact pads and the storage node contacts 40C, in order to decrease the contact resistance and/or avoid inter-diffusion between the materials that brings negative effects.

Furthermore, since it is preferable that the above-mentioned etching process used for forming the conductive patterns 40P does not etch the shallow trench isolation 11, the bottom surface of at least one of the plurality of storage node contacts 40C (such as the first bottom surface B1 shown in FIG. 14) and the bottom surface (such as the second bottom surface B2 as shown in FIG. 14) of at least one of the plurality of isolation patterns 50S (such as the isolation patterns 50S formed on the shallow trench isolation 11) may be coplanar, but not limited thereto. Because the isolation patterns 50S may be formed by filling the insulating layer 50 into the trenches between the conductive patterns 40P with, each of the storage node contacts 40C may be formed between two adjacent isolation patterns 50S and may be directly in contact with these two isolation patterns 50S. Besides, each of the storage node contacts 40C is surrounded by two adjacent bit line structures 30 in the second direction D2 and two adjacent isolation patterns 50S in the first direction D1, and the conductive layer 40 used for forming the storage node contacts 40C is formed after forming the bit line structures 30, thus the width of each of the storage node contacts 40C in the second direction D2 can be defined by the distance between the two adjacent bit line structures 30. In other words, the storage node contacts 40C may be formed by a self-aligned method, and the bottom line width of the storage node contacts 40C can thus be maximized.

To sum up the manufacturing method of the semiconductor storage device in this present invention, the storage node contacts are formed by first forming the conductive patterns and then forming the isolation patterns between the conductive patterns. Compare to the method of first forming isolation patterns and then filling the gaps of the isolation patterns with conductive patterns for forming storage node contacts, the manufacturing method of the present invention do not require forming a patterned oxide layer for defining the isolation patterns and thus the etching process for removing the patterned oxide layer is not needed, either. Hence the present invention can avoid negative effects on other material layers caused by the etching process for removing the patterned oxide layer. Based on the above reasons, the present invention brings the advantages of simplifying the manufacturing process and increasing the product yield of the process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor storage device, comprising:
   providing a semiconductor substrate comprising a plurality of active areas;
   forming a plurality of bit line structures on the semiconductor substrate;
   forming a plurality of storage node contacts disposed between the plurality of bit line structures, wherein each of the storage node contacts is formed on one of the active areas, each of the storage node contacts directly contacts the corresponding active area, and a step of forming the plurality of storage node contacts comprises:
      forming a plurality of conductive patterns on the semiconductor substrate, wherein each of the conductive patterns straddles at least one of the plurality of bit line structures; and
      performing an etching back process to the plurality of the conductive patterns so as to decrease a thickness of the plurality of conductive patterns and form the plurality of storage node contacts; and
   forming a plurality of isolation patterns disposed between the plurality of conductive patterns, wherein the plurality of isolation patterns are formed after forming the plurality of conductive patterns and before the etching back process, and each of the isolation patterns is directly in contact with at least one of the plurality of active areas.

2. The manufacturing method of a semiconductor storage device according to claim 1, wherein a step of forming the plurality of isolation patterns comprises:
   forming an insulating layer on the semiconductor substrate and the plurality of conductive patterns, wherein a part of the insulating layer is formed between the plurality of conductive patterns; and
   removing the insulating layer vertically laying on the plurality of conductive patterns so as to expose the plurality of conductive patterns.

3. The manufacturing method of a semiconductor storage device according to claim 2, wherein a step of removing the insulating layer vertically laying on the plurality of conductive patterns is performed before the etching back process.

4. The manufacturing method of a semiconductor storage device according to claim 3, wherein after the etching back process, a top surface of each of the storage node contacts is lower than a top surface of each of the insolation patterns.

5. The manufacturing method of a semiconductor storage device according to claim 1, wherein each of the bit line structures extends along a first direction, each of the isolation patterns extends along a second direction, and each of the storage node contacts is surrounded by two of the plurality of bit line structures adjacent to each other and two of the plurality of isolation patterns adjacent to each other.

6. The manufacturing method of a semiconductor storage device according to claim 5, wherein each of the conductive patterns extends along the second direction.

7. The manufacturing method of a semiconductor storage device according to claim 1, wherein each of the storage node contacts is formed between two of the plurality of isolation patterns adjacent to each other and is directly in contact with the plurality of isolation patterns.

8. The manufacturing method of a semiconductor storage device according to claim 1, wherein a portion of the conductive patterns vertically laying on the plurality of bit line structures is removed through the etching back process.

9. The manufacturing method of a semiconductor storage device according to claim 1, wherein a bottom surface of at least one of the plurality of storage node contacts and a bottom surface of at least one of the plurality of isolation patterns are coplanar.

10. The manufacturing method of a semiconductor storage device according to claim 1, wherein a step of forming the plurality of conductive patterns comprises:
   forming a conductive layer on the semiconductor substrate and on the plurality of bit line structures, wherein a portion of the conductive layer is formed between the plurality of the bit line structures; and
   patterning the conductive layer for forming the plurality of conductive patterns, wherein a portion of each of the conductive patterns is formed between two of the plurality of bit line structures adjacent to each other.

11. The manufacturing method of a semiconductor storage device according to claim 10, wherein the conductive layer comprises a silicon conductive layer.

* * * * *